(12) United States Patent
Nagasawa et al.

(10) Patent No.: US 8,896,973 B2
(45) Date of Patent: Nov. 25, 2014

(54) MAGNETIC HEAD WITH A SPIN TORQUE OSCILLATOR, MAGNETIC SENSOR, AND MAGNETIC RECORDING/REPRODUCING APPARATUS

(71) Applicants: Tazumi Nagasawa, Yokohama (JP); Hirofumi Suto, Tokyo (JP); Kiwamu Kudo, Kamakura (JP); Rie Sato, Yokohama (JP); Koichi Mizushima, Kamakura (JP); Tao Yang, Yokohama (JP)

(72) Inventors: Tazumi Nagasawa, Yokohama (JP); Hirofumi Suto, Tokyo (JP); Kiwamu Kudo, Kamakura (JP); Rie Sato, Yokohama (JP); Koichi Mizushima, Kamakura (JP); Tao Yang, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/655,940

(22) Filed: Oct. 19, 2012

(65) Prior Publication Data

US 2013/0107395 A1    May 2, 2013

(30) Foreign Application Priority Data

Oct. 28, 2011    (JP) ................................. 2011-237383

(51) Int. Cl.
*G11B 5/39*        (2006.01)
*G01R 33/09*     (2006.01)

(52) U.S. Cl.
CPC ............ *G01R 33/093* (2013.01); *G11B 5/3932* (2013.01); *G11B 5/3909* (2013.01); *G11B 2005/3996* (2013.01)
USPC .................................. 360/324.12; 360/324.2

(58) Field of Classification Search
USPC .................. 360/125.3, 313, 319, 322, 324.1, 360/324.11, 324.12, 324.2
See application file for complete search history.

(56) References Cited

U.S. PATENT DOCUMENTS

| | | | |
|---|---|---|---|
| 7,602,588 B2 | 10/2009 | Sato et al. | |
| 7,667,933 B2 | 2/2010 | Kudo et al. | |
| 8,320,080 B1 * | 11/2012 | Braganca et al. | 360/128 |
| 8,432,644 B2 * | 4/2013 | Braganca et al. | 360/324 |
| 8,446,698 B2 * | 5/2013 | Fuji et al. | 360/313 |
| 8,462,461 B2 * | 6/2013 | Braganca et al. | 360/125.3 |
| 2006/0221507 A1 | 10/2006 | Sato et al. | |

(Continued)

FOREIGN PATENT DOCUMENTS

| | | |
|---|---|---|
| JP | 4098786 | 3/2008 |
| JP | 4585353 | 9/2010 |

OTHER PUBLICATIONS

S.I. Kiselev, et al., "Microwave oscillations of a nanomagnet driven by a spin-polarized current", Nature vol. 425 Sep. 25, 2003, 4 pages.

*Primary Examiner* — Jefferson Evans
(74) *Attorney, Agent, or Firm* — Oblon, Spivak, McClelland, Maier & Neustadt, L.L.P.

(57) ABSTRACT

A magnetic head according to an embodiment includes: a spin-torque oscillator comprising a first ferromagnetic layer, a second ferromagnetic layer, a third ferromagnetic layer provided on the opposite side of the second ferromagnetic layer from the first ferromagnetic layer, a first nonmagnetic layer provided between the first ferromagnetic layer and the second ferromagnetic layer, a second nonmagnetic layer provided between the second ferromagnetic layer and the third ferromagnetic layer, a first electrode provided on a surface on the opposite side of the first ferromagnetic layer from the first nonmagnetic layer, and a second electrode provided on a surface on the opposite side of the third ferromagnetic layer from the second nonmagnetic layer. Magnetization precession is induced in each of the first through third ferromagnetic layers when current is applied between the first and second electrodes.

18 Claims, 9 Drawing Sheets

(56) References Cited

U.S. PATENT DOCUMENTS

| | | |
|---|---|---|
| 2006/0222835 A1 | 10/2006 | Kudo et al. |
| 2008/0304176 A1* | 12/2008 | Takagishi et al. ............... 360/86 |
| 2011/0228423 A1* | 9/2011 | Koui et al. ...................... 360/75 |
| 2012/0245477 A1* | 9/2012 | Giddings et al. .............. 600/485 |
| 2013/0107395 A1* | 5/2013 | Nagasawa et al. .............. 360/75 |

* cited by examiner

MAGNETIC HEAD WITH A SPIN TORQUE OSCILLATOR, MAGNETIC SENSOR, AND MAGNETIC RECORDING/REPRODUCING APPARATUS

CROSS-REFERENCE TO RELATED APPLICATION

This application is based upon and claims the benefit of priority from prior Japanese Patent Application No. 2011-237383 filed on Oct. 28, 2011 in Japan, the entire contents of which are incorporated herein by reference.

FIELD

Embodiments described herein relate generally to magnetic heads, magnetic sensors, and magnetic recording/reproducing apparatuses.

BACKGROUND

A magnetic hard disk drive (hereinafter also referred to as HDD) includes a rotating magnetic disk as a recording medium, a recording/reproducing head supported by a suspension arm, and an actuator for actuating the suspension arm. Magnetic information recorded on the magnetic disk is read with a magnetic sensor in the reproducing head. As the magnetic sensor for the reproducing head, a magnetoresistive sensor such as a GMR sensor or a TMR sensor has been conventionally used.

The magnetic recording density in each HDD has been increasing year by year. The highest surface recording density of HDDs currently on the market is approximately 600 Gbits/in$^2$. According to the HDD technology road map, the surface recording density will reach 1 Tbit/in$^2$ around the year 2013, and to 2 Tbits/in$^2$ around the year 2015.

To increase a surface recording density is to reduce the size of recording bits in the magnetic disk, and the size of the magnetoresistive sensor needs to be reduced accordingly. Therefore, the track width and the distance between shields in each magnetoresistive sensor are reduced. However, it is considered that, if the size of each magnetoresistive sensor is further reduced in the future, thermal magnetic noise due to fluctuations caused by the heat of magnetization in the magnetic material will increase, and a practical SN (Signal-to-Noise) ratio in reproduced signals will not be maintained.

To avoid the problem of thermal magnetic noise, there have been known reproducing heads each including a spin-torque oscillator.

A spin-torque oscillator (also referred to as STO) has a fundamental structure that is a film stack formed by stacking a free layer, a nonmagnetic spacer layer, and a pinned layer (a magnetization pinned layer). By applying current to the STO, the magnetization of the free layer enters a steady oscillatory state due to spin-polarized current. The above described fundamental film structure is the same as that of a CPP (Current Perpendicular to Plane)-GMR (Giant Magneto-Resistive) head and that of a TMR (Tunnel Magneto-Resistive) head, and an output of the STO derives from a magnetoresistive effect. Therefore, the STO outputs a high-frequency signal in accordance with oscillations of the magnetization of the free layer. That is, the STO is an oscillator that outputs an oscillation voltage deriving from oscillations of the magnetization of the free layer. In view of this, the free layer of an STO is also called an oscillating layer.

In a reproducing head including a spin-torque oscillator (hereinafter also referred to as the STO reproducing head), an STO is used as the magnetic sensor. By using the fact that the amplitude and frequency of magnetization oscillations in the free layer in an STO depend on an external magnetic field acting on the STO, changes in the amplitude of magnetization oscillations or changes in frequency or phase due to a medium magnetic field generated from medium bits are detected, and magnetic information is read. The magnetization oscillations in an STO are induced by applying current. Therefore, it is considered that, when the magnetization oscillation energy of the STO is sufficiently larger than the thermal energy, fluctuations of the magnetization due to heat are relatively restrained, and it is possible to achieve a sufficiently higher SN ratio than that achieved by a reproducing method using a conventional magnetoresistive sensor. There is a known technique suitable for achieving a higher SN ratio and perform higher-speed reproduction in a case where changes in frequency or phase are detected than in a case where changes in oscillation amplitude are detected. In view of this, it is considered that the problem of thermal magnetic noise can be avoided by using an STO as the magnetic sensor.

Other than the above-mentioned problem of thermal magnetic noise, an increase in resolution also, causes a problem in increasing the recording density. When a reproducing head accesses a bit from which information is to be read (a target bit), not only the magnetic field from the target bit but also the magnetic fields from the adjacent medium bits act on the reproducing head, resulting in a low accuracy in the information reading. Therefore, the distance between magnetic shields in each reproducing head using a magnetoresistive sensor is made shorter, to restrain interferences between bits and achieve a higher resolution. This measure is considered effective in STO reproducing heads, and there have been known reproducing heads each having an STO interposed between two shield films.

In each conventional STO reproducing head, however, the fundamental film structure of the STO is the same as that of a CPP-GMR head or a TMR head, and it is difficult to reduce the intershield distance to 15 nm or shorter due to a requirement for the film thickness of the STO. Therefore, it is considered difficult to use such an STO reproducing head to read information from a medium of 4 Tbits/in$^2$ or higher in terms of resolution. The requirement for the film thickness of an STO is set for the following reasons. If the film thickness of the antiferromagnetic layer for pinning the magnetization of the pinned layer that accounts for a large portion of the entire film thickness becomes 5 nm or smaller, the unidirectional magnetic anisotropic constant becomes rapidly lower, and the magnetization of the pinned layer is not pinned. Therefore, the film thickness of the antiferromagnetic layer needs to be greater than 5 nm.

In a case where an STO is used as a magnetic sensor, the problem of thermal magnetic noise due to miniaturization of the device can be more effectively avoided than in a case where a conventional CPP-GMR head or TMR head is used. As for higher resolutions, however, an STO magnetic sensor has the same problem as that of a conventional CPP-GMR head and TMR head, and there is a demand for a high-output and high-Q STO that has a small film thickness and is suitable for high-density magnetic recording and reproduction.

DETAILED DESCRIPTION

Figure 1:
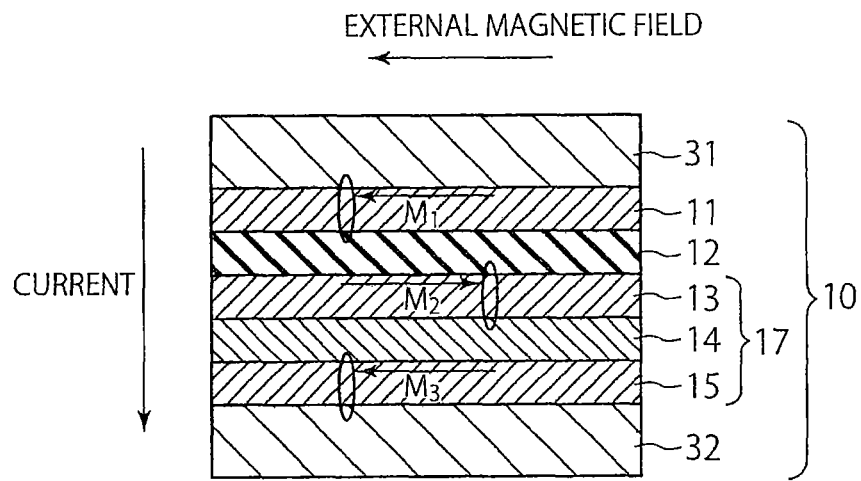
FIG. 1 is a cross-sectional view of a spin-torque oscillator according to a first embodiment.

A magnetic head according to an embodiment includes: a spin-torque oscillator, the spin-torque oscillator including a first ferromagnetic layer, a second ferromagnetic layer, a third ferromagnetic layer provided on the opposite side of the second ferromagnetic layer from the first ferromagnetic layer, a first nonmagnetic layer provided between the first ferromagnetic layer and the second ferromagnetic layer, a second nonmagnetic layer provided between the second ferromagnetic layer and the third ferromagnetic layer, a first electrode provided on a surface on the opposite side of the first ferromagnetic layer from the first nonmagnetic layer, and a second electrode provided on a surface on the opposite side of the third ferromagnetic layer from the second nonmagnetic layer. The second ferromagnetic layer and the third ferromagnetic layer are antiferromagnetically coupled to each other via the second nonmagnetic layer, magnetization directions of the first ferromagnetic layer and the second ferromagnetic layer are antiparallel to each other when current is not applied between the first and second electrodes, and magnetization precession is induced in each of the first through third ferromagnetic layers when current is applied between the first and second electrodes.

The following is a description of embodiments, with reference to the accompanying drawings. Throughout the embodiments and examples, like components are denoted by like reference numerals, and the same explanation will not be repeated more than once. Each of the drawings is a schematic view for ease of explanation and understanding of the invention. The shapes, sizes, and proportions in the drawings might differ from those in reality, but changes can be made to them by taking into account the following description and the conventional arts.

First Embodiment

A magnetic head according to a first embodiment includes a spin-torque oscillator, and this spin-torque oscillator is used as a magnetic sensor. FIG. 1 shows the spin-torque oscillator 10 according to the first embodiment.

The spin-torque oscillator 10 has a film stack that includes a first ferromagnetic layer 11, a second ferromagnetic layer 13, a third ferromagnetic layer 15 provided on the opposite side of the second ferromagnetic layer 13 from the first ferromagnetic layer 11, a first nonmagnetic layer 12 interposed between the first ferromagnetic layer 11 and the second ferromagnetic layer 13, and a second nonmagnetic layer 14 interposed between the second ferromagnetic layer 13 and the third ferromagnetic layer 15. The spin-torque oscillator 10 further includes a pair of electrodes 31 and 32 that are provided to sandwich the above described film stack and apply current perpendicularly to the film plane. Here, the film plane means a plane perpendicular to the stacking direction of the film stack. The second ferromagnetic layer 13 and the third ferromagnetic layer 15 are antiferromagnetically coupled via the second nonmagnetic layer 14. That is, the second ferromagnetic layer 13, the second nonmagnetic layer 14, and the third ferromagnetic layer 15 constitute an antiferromagnetically-coupled film 17. In this embodiment, the first through third ferromagnetic layers 11, 13, and 15 have magnetization directions substantially parallel to the film plane. In FIG. 1, the film stack has a structure in which the first ferromagnetic layer 11 is placed at the top, or the third ferromagnetic layer 15, the second nonmagnetic layer 14, the second ferromagnetic layer 13, the first nonmagnetic layer 12, and the first ferromagnetic layer 11 are stacked in this order. However, the stacking sequence in the film stack can be reversed. That is, the above described film stack can have a structure in which the first ferromagnetic layer 11, the first nonmagnetic layer 12, the second ferromagnetic layer 13, the second nonmagnetic layer 14, and the third ferromagnetic layer 15 are stacked in this order.

In the spin-torque oscillator 10, current is applied to the film stack via the electrodes 31 and 32, so that magnetization precession is induced in all the ferromagnetic layers, or each of the first through third ferromagnetic layers 11, 13, and 15 by virtue of a spin-torque transfer effect. A rotating magnetic field having the frequency of the precession (magnetic resonance frequency) is output from each of the ferromagnetic layers. The magnetic resonance frequency varies with the magnitude and direction of an external magnetic field applied to the ferromagnetic layers. As the relative magnetization angle between the first ferromagnetic layer 11 and the second ferromagnetic layer 13 varies, the resistance varies. Therefore, the first through third ferromagnetic layers 11, 13, and 15 of the spin-torque oscillator 10 are free layers. Since the spin-torque oscillator 10 does not include an antiferromagnetic layer, the thickness of the spin-torque oscillator 10 minus the electrodes 31 and 32 can be made 13 nm or smaller.

Each of the electrodes 31 and 32 is made of a conductive material. The conductive material can be a conductive material serving as a magnetic shield, such as a soft magnetic material. In such a case, magnetic information from the bits other than the bit to be reproduced from the magnetic recording medium can be shielded.

Each of the first through third ferromagnetic layers 11, 13, and 15 is a ferromagnetic material containing Co, Ni, or Fe, or an alloy containing those ferromagnetic materials, for example. Each of the first through third ferromagnetic layers 11, 13, and 15 can be a film stack of ferromagnetic materials, to adjust magnetic characteristics or increase the MR effect.

The nonmagnetic layer 12 can be a nonmagnetic material such as Cu, Ag, or Cr, or a nonmagnetic alloy containing those nonmagnetic materials. In this embodiment, a Cu layer is used as the nonmagnetic layer 12. Alternatively, the nonmagnetic layer 12 can be an insulating film such as a MgO film or an $Al_2O_3$ (aluminum oxide) film. There can exist a metallic current path in the insulating film.

The antiferromagnetically-coupled film 17 can be an artificial antiferromagnetic film in which the two ferromagnetic layers 13 and 15 have the same magnetic moment, or an artificial ferrimagnetic film in which one of the ferromagnetic layers 13 and 15 has a larger magnetic moment than that of the other. In such a case, when a magnetic field is applied in the direction of the easy axis of magnetization formed by crystal anisotropy or shape anisotropy, a magnetization reversal is not caused over a wider magnetic field range than in the case of a single-layer film. Therefore, when an external magnetic field acting in a direction anti-parallel to the magnetization direction of the second ferromagnetic layer 13 is applied to the spin-torque oscillator 10, the magnetization direction of the first ferromagnetic layer 11 can be made the same as the direction of the external magnetic field, and the magnetization directions of the first ferromagnetic layer 11 and the second ferromagnetic layer 13 can be made substantially antiparallel to each other (antiparallel arrangement) over a wide magnetic field range.

Figure 2:
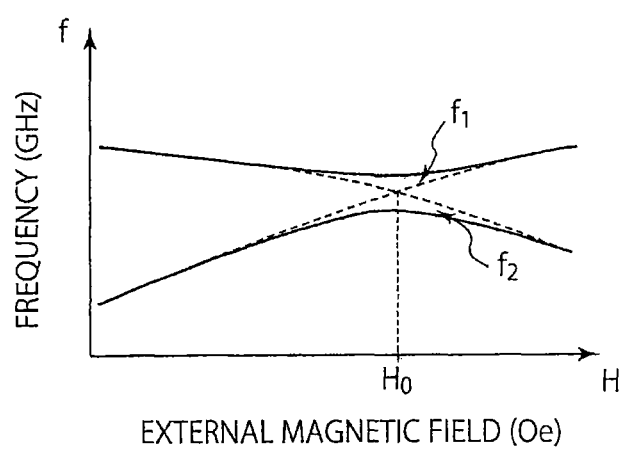
FIG. 2 is a diagram illustrating the external magnetic field dependence of oscillation frequencies in the spin-torque oscillator of the first embodiment.

An external magnetic field antiparallel to the magnetization of the second ferromagnetic layer 13 is applied to the spin-torque oscillator 10, so that the magnetization directions of the first ferromagnetic layer 11 and the second ferromagnetic layer 13 become antiparallel to each other. FIG. 2 illustrates the original magnetic resonance frequencies $f_1$ and $f_2$ (dashed lines) of the first ferromagnetic layer 11 and the antiferromagnetically-coupled film 17 in a case where a current is applied in the above described situation, and the external magnetic field dependent properties of the frequencies of the oscillation modes (solid lines) combined by mutual spin torques or a dipole interaction in the above described situation. As for the external magnetic field dependent properties of the magnetic resonance frequency $f_1$ of the first ferromagnetic layer 11, the magnetic resonance frequency becomes higher with an increase in the external magnetic field, since the external magnetic field is applied in the same direction as the magnetization. As for the external magnetic field dependent properties of the magnetic resonance frequency $f_2$ of the antiferromagnetically-coupled film 17, the magnetic resonance frequency becomes lower with an increase in the external magnetic field, since the magnetization direction of the ferromagnetic layer closest to the first ferromagnetic layer 11 in the antiferromagnetically-coupled film 17 or the magnetization direction of the second ferromagnetic layer 13 becomes the opposite of the direction of the external magnetic field. Accordingly, when an external magnetic field $H_0$ is applied to the spin-torque oscillator 10 including the first ferromagnetic layer 11 and the antiferromagnetically-coupled film 17 can have the magnetic resonance frequencies $f_1$ and $f_2$ crossing each other.

When an external magnetic field is applied to the spin-torque oscillator 10 having the above structure so that the magnetization directions of the first ferromagnetic layer 11 and the second ferromagnetic layer 13 become antiparallel to each other, the first ferromagnetic layer 11 and the antiferromagnetically-coupled film 17 are coupled to each other by a mutual spin-torque transfer effect and a dipole interaction upon application of an current. As a result, the magnetization of each of the first through third ferromagnetic layers 11, 13, and 15 oscillates, and oscillations at the magnetic resonance frequency are induced in response to the external magnetic field, as indicated by the solid lines in FIG. 2. Thus, a rotating magnetic field is generated from each of the ferromagnetic layers 11, 13, and 15. In the antiparallel arrangement, the magnetization direction of the first ferromagnetic layer 11 does not need to form the angle of 180 degrees with the magnetization direction of the second ferromagnetic layer, but is allowed to have a declination of a few tens of degrees, as long as oscillations can be induced. However, if the magnetization directions of the first and second ferromagnetic layers are arranged at 90 degrees as in a conventional magnetoresistive device, the oscillation threshold current becomes extremely high, and it becomes very difficult to induce oscillations.

The coupled oscillation mode of the spin-torque oscillator 10 is a low-frequency acoustic mode or a high-frequency optical mode, depending on the direction of current and the magnitude of an external magnetic field. Unlike a conventional spin-torque oscillator that includes a free layer, a pinned layer, and a nonmagnetic layer interposed between the free layer and the pinned layer, and has oscillations generated from the free layer, the spin-torque oscillator 10 of this embodiment has the first through third ferromagnetic layers 11, 13, and 15 contributing to oscillations. Accordingly, the spin-torque oscillator 10 has a larger magnetization oscillation energy than the thermal energy, and also has an excellent frequency stability. Also, as all the ferromagnetic layers 11, 13, and 15 oscillate, high-output and high-Q oscillations can be realized. Thus, the spin-torque oscillator 10 of this embodiment can achieve high-output and high-Q oscillations.

Also, as shown in FIG. 2, in a region near the external magnetic field $H_0$ where oscillation frequencies cross, two modes are easily excited at the same time. Therefore, stable oscillations are not achieved, and the oscillation output becomes extremely low. With the external magnetic field outside the region near the external magnetic field $H_0$, however, extremely strong oscillations occur, and when the magnitude of the external magnetic field exceeds the value $H_0$, a jump occurs in oscillation frequency. Since the spin-torque oscillator of this embodiment has the above features, oscillations at different frequencies can be achieved simply by changing the current direction in the same magnetic field environment, and oscillations at the same frequency can be achieved simply by changing the current direction in different magnetic field environments, depending on designs. Also, this embodiment can also be applied to a high-sensitivity magnetic sensor that utilizes the unique external magnetic field $H_0$.

Furthermore, in the spin-torque oscillator 10 of this embodiment, not only oscillation frequencies vary between the respective oscillation modes, but the oscillation phase difference between the first ferromagnetic layer 11 and the antiferromagnetically-coupled film 17 is 180 degrees. Also, the high-frequency magnetic field space distributions caused by the dipole generated from the spin-torque oscillator 10 vary. Accordingly, the spin-torque oscillator 10 of this embodiment can be used as a device to generate high-frequency magnetic fields and assist magnetic recording.

In this manner, the spin-torque oscillator 10 can reduce the thickness thereof, and achieve high-output and high-Q oscillations.

The film thickness of a spin-torque oscillator can be reduced by forming a three-layer structure in which a nonmagnetic material is interposed between two ferromagnetic materials. In such a case, however, the range to maintain an antiparallel state with an external magnetic field is narrow, and therefore, the above described high-output and high-Q oscillations are not achieved.

Second Embodiment

Figure 3:
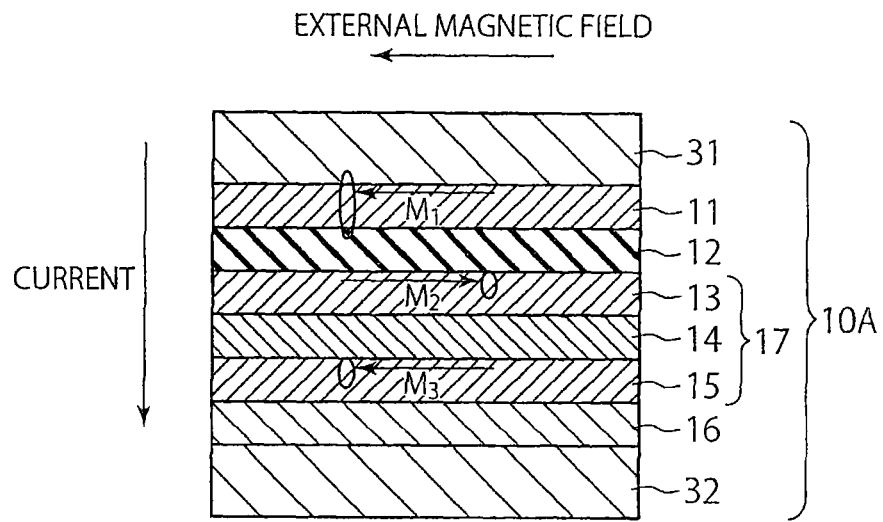
FIG. 3 is a cross-sectional view of a spin-torque oscillator according to a second embodiment.

A magnetic head according to a second embodiment is now described. Like the magnetic head of the first embodiment, the magnetic head of the second embodiment includes a spin-torque oscillator. FIG. 3 shows the spin-torque oscillator according to the second embodiment. The spin-torque oscillator 10A according to the second embodiment differs from the spin-torque oscillator 10 shown in FIG. 1 in that an adjustment layer 16 is provided between the first ferromagnetic layer 11 and the electrode 31, and/or between the third ferromagnetic layer 15 and the electrode 32. In FIG. 3, the adjustment layer 16 is provided between the third ferromagnetic layer 15 and the electrode 32. The electrodes 31 and 32 are magnetic shields, and the portion between the electrodes 31 and 32 is the distance between shields. Accordingly, with the adjustment layer 16, the distance between shields can be adjusted independently of the thickness of the film stack of the spin-torque oscillator 10A. The adjustment layer 16 can also serve as a seed layer or a cap layer.

The adjustment layer 16 can be made of a nonmagnetic metal material such as Ta, Ru, or Cu, an alloy containing those materials, or a stack structure of those materials. An antiferromagnetic material such as IrMn can be used as the adjustment layer 16, if the antiferromagnetic material is made thin. In such a case, the antiferromagnetic material preferably has such a thickness that the magnetizations of the ferromagnetic layers are not pinned. Specifically, the thickness of the antiferromagnetic material is preferably 5 nm or smaller, or more preferably, 2 nm or smaller.

Like the magnetic head of the first embodiment, the magnetic head of the second embodiment can reduce the film thickness, and achieve high-output and high-Q oscillations.

Third Embodiment

A magnetic head according to a third embodiment is now described. In the magnetic head of the third embodiment, an insulating material such as MgO or $Al_2O_3$ (aluminum oxide film) is used as the first nonmagnetic layer 12 of the spin-torque oscillator according to the first or second magnetic head. Particularly, a spin-torque oscillator using MgO as the first nonmagnetic layer 12 has a high MR ratio, and accordingly, can have a higher output than that of the first or second embodiment.

Like the first or second embodiment, the third embodiment can reduce the film thickness and achieve high-Q oscillations.

Fourth Embodiment

Figure 4:
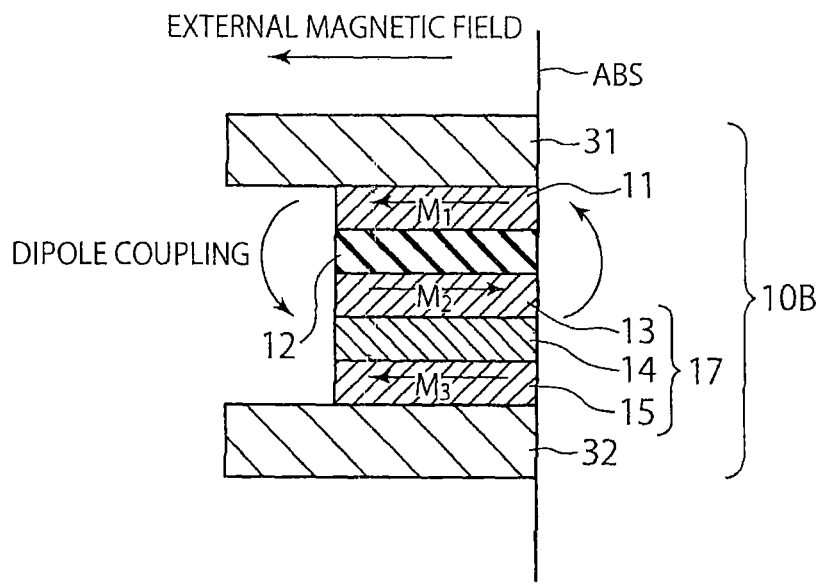
FIG. 4 is a cross-sectional view of a spin-torque oscillator according to a fourth embodiment.

A magnetic head according to a fourth embodiment is now described. The magnetic head of the fourth embodiment includes a spin-torque oscillator, and this spin-torque oscillator is used as a magnetic sensor. FIG. 4 shows the spin-torque oscillator 10B of the fourth embodiment. The spin-torque oscillator 10B differs from the spin-torque oscillator 10 according to the first embodiment illustrated in FIG. 1 in that microfabrication is performed on the film stack including the first ferromagnetic layer 11, the first nonmagnetic layer 12, the second ferromagnetic layer 13, the second nonmagnetic layer 14, and the third ferromagnetic layer 15, to form a pillar-like structure. Therefore, the size of the film stack is smaller than the size of the film stack in the spin-torque oscillator of the first embodiment. Here, the size of a film stack means the average of the sizes of the respective layers constituting the film stack, and the size of a layer means the diameter of the layer. The diameter of a layer means the longest distance between peripheral two points of a planar shape that is perpendicular or substantially perpendicular to the stacking direction of the respective layers. For example, the longest distance is the length of a diagonal line where the layer has a rectangular planar shape, the longest distance is the diameter where the layer has a circular planar shape, and the longest distance is the length of the long axis where the layer has an elliptical planar shape.

The spin-torque oscillator 10B also includes a side surface serving as an ABS (Air Bearing Surface). That is, one of the side surfaces extending in the stacking direction of the film stack is the ABS, and this side surface is almost flat. The ABS faces the upper face of a magnetic recording medium.

In general, spin-torque oscillators are classified into a point contact type that does not have microfabrication performed on the film stack, and a pillar type having microfabrication performed on the film stack. In a case where an insulating material such as MgO is used as the first nonmagnetic layer 12, a high MR ratio is advantageously achieved. However, the density of current to be applied is lower than in a case where a nonmagnetic metal is used, and the coupling by the mutual spin torque between the first ferromagnetic layer 11 and the second ferromagnetic layer 13 is weaker due to asymmetrical spin torque efficiency. In view of this, a spin-torque oscillator of a pillar type having microfabrication performed at least on the first ferromagnetic layer 11 and the second ferromagnetic layer 13 is formed as in the fourth embodiment illustrated in FIG. 4. Accordingly, the coupling by the dipole interaction between the first ferromagnetic layer 11 and the second ferromagnetic layer 13 becomes stronger, and the coupled oscillation mode can be efficiently excited. To excite the coupled oscillation mode with high efficiency, the size of the film stack in the spin-torque oscillator 10b is preferably 200 nm or smaller, or more preferably, 50 nm or smaller.

In the spin-torque oscillator of the second embodiment, microfabrication can also be performed on the film stack including the first ferromagnetic layer 11, the first nonmagnetic layer 12, the second ferromagnetic layer 13, the second nonmagnetic layer 14, the third ferromagnetic layer 15, and the adjustment layer 16, so as to form a pillar-like structure as in the fourth embodiment.

Like the first embodiment, the fourth embodiment can reduce the film thickness, and achieve high-output and high-Q oscillations.

Fifth Embodiment

Figure 5:
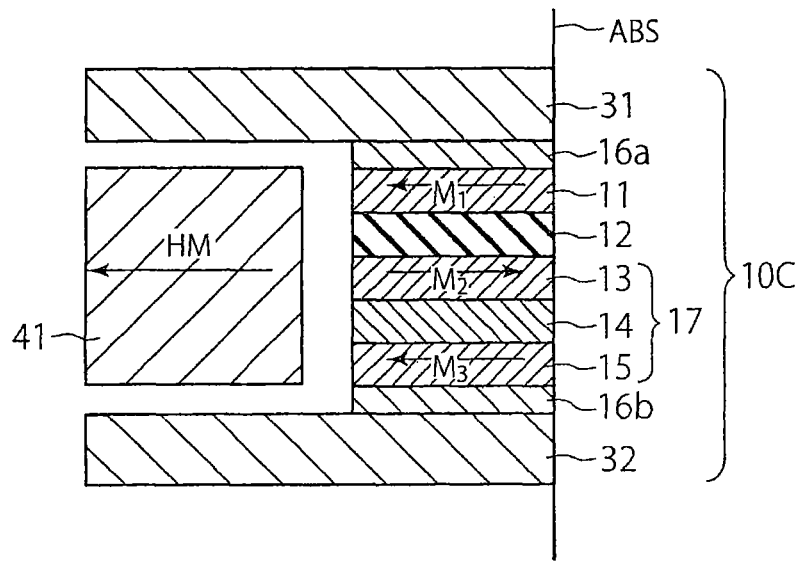
FIG. 5 is a cross-sectional view of a spin-torque oscillator according to a fifth embodiment.

A magnetic head according to a fifth embodiment is now described. The magnetic head of the fifth embodiment includes a spin-torque oscillator, and this spin-torque oscillator is used as a magnetic sensor. FIG. 5 shows the spin-torque oscillator 10C according to the fifth embodiment. The spin-torque oscillator 10C differs from the spin-torque oscillator 10 according to the first embodiment illustrated in FIG. 1 in that a hard bias film 41 is provided to apply an external magnetic field to the second ferromagnetic layer 13. In the fifth embodiment illustrated in FIG. 5, an adjustment layer 16a is provided between the electrode 31 and the first ferromagnetic layer 11, and an adjustment layer 16b is provided between the electrode 32 and the third ferromagnetic layer 15.

The spin-torque oscillator 10C has a side surface serving as the ABS. Specifically, one of the side surfaces extending in the stacking direction of the film stack serves as the ABS, and this side surface is almost flat. In the fifth embodiment illustrated in FIG. 5, the hard bias film 41 is provided in the vicinity of the side surface on the opposite side from the ABS in the spin-torque oscillator 10C. The hard bias film 41 can be provided in the vicinity of one of the following side surfaces: the side surface on the opposite side from the ABS; the side surface on the front side in FIG. 5; and the side surface on the back side in FIG. 5. An insulating material (not shown) is provided between the hard bias film 41 and the first through third ferromagnetic layers, and between the hard bias film 41 and the electrodes 31 and 32.

The hard bias film 41 is positioned to apply a magnetic field in a direction antiparallel to the magnetization of the second ferromagnetic layer 13. That is, a magnetic field generated from the hard bias film 41 is applied perpendicularly to the ABS, and the direction of the magnetic field can be the direction toward the ABS or the opposite of the direction toward the ABS. With the size of the magnetic field of a magnetic recording medium being taken into consideration, the magnitude of the magnetic field from the hard bias film 41 is designed not to exceed the magnetic field $H_0$, at which magnetic resonance frequencies cross each other.

The hard bias film 41 can be an alloy film such as a Co film, a Cr film, or a Pt film, or a hard magnetic film such as a CoCrPt film. Other than CoCrPt, a hard magnetic material that can apply a required magnetic field can be used.

Like the first embodiment, the fifth embodiment can also reduce the film thickness, and achieve high-output and high-Q oscillations.

In the fifth embodiment, it is important to induce oscillations when the magnetization directions of the first ferromagnetic layer 11 and the second ferromagnetic layer 13 are antiparallel to each other. In the antiferromagnetically-coupled film 17, the magnetic moment (the magnitude of magnetization) of the third ferromagnetic layer 15 is made larger than the magnetic moment of the second ferromagnetic layer 13. That is, the antiferromagnetically-coupled film 17 is made an artificial ferrimagnetic film, for example. In this manner, the magnetization direction of the second ferromagnetic layer 13 can be easily made the opposite of the direction of the external magnetic field.

Figure 6:
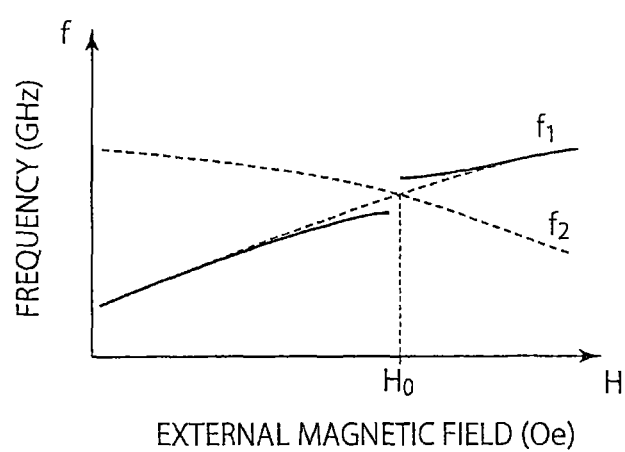
FIG. 6 is a diagram illustrating the external magnetic field dependence of oscillation frequencies in the spin-torque oscillator of the fifth embodiment.

When current is applied in the direction from the first ferromagnetic layer 11 toward the second ferromagnetic layer 13, or when electrons are made to flow in the direction from the second ferromagnetic layer 13 toward the first ferromagnetic layer 11, a coupled oscillation mode in which mainly the first ferromagnetic layer 11 oscillates at the magnetic resonance frequency $f_1$ can be excited, as shown in FIG. 6. Oscillations in this mode have high external magnetic field dependence of frequency. By using this oscillation mode, a magnetic head with a high magnetic field sensitivity can be realized.

Figure 7:
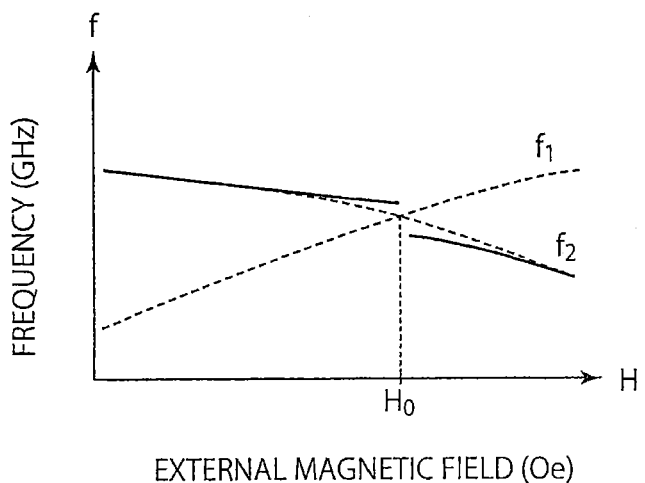
FIG. 7 is a diagram illustrating the external magnetic field dependence of oscillation frequencies in the spin-torque oscillator of the fifth embodiment.

When current is applied in the direction from the second ferromagnetic layer 13 toward the first ferromagnetic layer 11, or when electrons are made to flow in the direction from the first ferromagnetic layer 11 toward the second ferromagnetic layer 13, on the other hand, a coupled oscillation mode in which mainly the antiferromagnetically-coupled film 17 oscillates at the magnetic resonance frequency $f_2$ can be excited, as shown in FIG. 7. Oscillations in this mode have relatively low external magnetic field dependence of frequency, and oscillations with an excellent frequency stability can be achieved. By using this oscillation mode, reproduction with a high stability can be performed even in a magnetic field environment having large changes and gradients in the magnetic field.

The same effects as those of the fifth embodiment can also be achieved by providing a hard bias film in the magnetic head of the second embodiment in the same manner as in the fifth embodiment.

Sixth Embodiment

Figure 8:
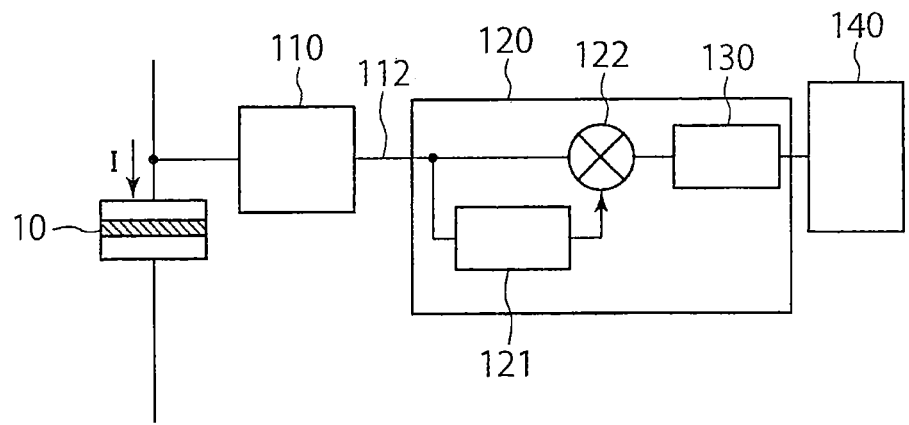
FIG. 8 is a block diagram of a magnetic sensor according to a sixth embodiment.

A magnetic sensor according to a sixth embodiment is now described. FIG. 8 shows the magnetic sensor according to the sixth embodiment. The magnetic sensor of the sixth embodiment includes the spin-torque oscillator 10 used in the magnetic head of the first embodiment illustrated in FIG. 1, a high-frequency filter 110, a delay detector circuit 120, a delay circuit 121, a mixer 122, a low-pass filter 130, and a voltmeter 140.

Next, operations of the magnetic sensor according to the sixth embodiment are described. By applying a direct current I to the spin-torque oscillator 10, magnetization precession is induced, and a high-frequency magnetic field is generated by a magnetoresistive effect. The high-frequency component is extracted at the high-frequency filter 110, and the extracted signal 112 is divided into two signals. One divisional signal of the divided signal 112 has its phase delayed at the delay circuit 12, and is turned into a delayed signal. This delayed signal is superimposed on the original signal 112 at the mixer 122. The excess high-frequency component is cut off from the superimposed signal at the low-pass filter 130. The output of the low-pass filter 130 is then monitored at the voltmeter 140, to recognize the change in the high-frequency signal phase.

As the external magnetic field varies, the frequency of the magnetization precession varies. Therefore, the frequency of the high-frequency magnetic field from the spin-torque oscillator 10 also varies. By detecting the frequency change as a phase change with the magnetic sensor of the sixth embodiment, a change in the external magnetic field can be detected. That is, the magnetic sensor of the sixth embodiment includes a monitoring device that monitors changes in the amplitude of a high-frequency oscillation voltage generated between the first and second electrodes 31 and 32 due to magnetization precession induced in at least one of the first and second ferromagnetic layers 11 and 13 by applying current to the magnetic head, or changes in the oscillation frequency due to an external magnetic field. This device excels in high-speed reading from magnetic records. However, the monitoring device is not limited to the above described device, as long as changes in the amplitude or changes in the high frequency due to changes in the external magnetic field can be monitored.

As described above, the sixth embodiment can achieve high-output and high-Q oscillations, like the first embodiment.

Although the magnetic sensor of the sixth embodiment uses the spin-torque oscillator of the first embodiment, the same effects as above can also be achieved by using the spin-torque oscillator of any of the second through fifth embodiments.

Seventh Embodiment

A magnetic recording/reproducing apparatus according to a seventh embodiment is now described.

A magnetic head according to any one of the first through fifth embodiments is incorporated into a magnetic head assembly of a recording/reproducing type, and can be mounted on a magnetic recording/reproducing apparatus. The magnetic recording/reproducing apparatus according to this embodiment can have a reproducing function, or can have both a recording function and a reproducing function.

Figure 9:
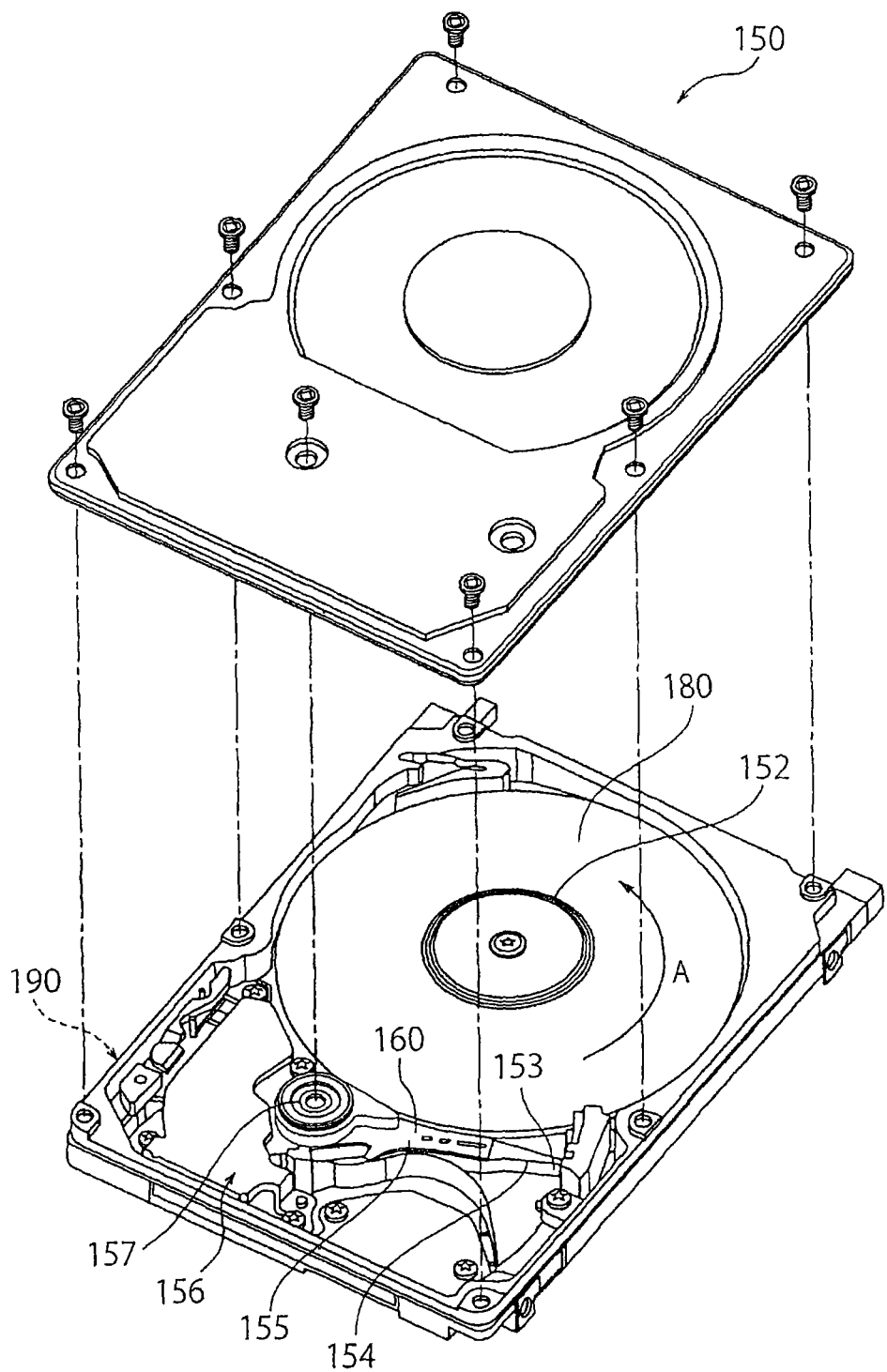
FIG. 9 is a schematic perspective view of a magnetic recording/reproducing apparatus according to a seventh embodiment.

FIG. 9 is a schematic perspective view showing an example structure of the magnetic recording/reproducing apparatus according to the seventh embodiment. As shown in FIG. 9, the magnetic recording/reproducing apparatus 150 according to this embodiment is a device that uses a rotary actuator. In the drawing, a recording medium disk 180 is mounted on a spindle motor 152, and is rotated in the direction of the arrow A by a motor (not shown) that responds to a control signal from a drive controller (not shown). The magnetic recording/reproducing apparatus 150 according to this embodiment can include more than one recording medium disk 180.

A head slider 153 that records and reproduces information stored on the recording medium disk 180 is attached to the edge of a thin-film suspension 154. Here, a magnetic head of one of the above described embodiments, as well as a magnetic shield, is mounted on a portion near the edge of the head slider 153.

When the recording medium disk 180 rotates, the ABS of the head slider 153 is held at a predetermined floating distance from the surface of the recording medium disk 180. The head slider 153 can be of a so-called "contact moving type", and be in contact with the recording/reproducing medium disk 180.

The suspension 154 is connected to one end of an actuator arm 155 that has a bobbin unit holding a drive coil (not shown). A voice coil motor 156 that is one type of linear motor is provided at the other end of the actuator arm 155. The voice coil motor 156 can include the drive coil (not shown) wound around the bobbin unit of the actuator arm 155, and a magnetic circuit formed with a permanent magnet and an opposed yoke that are positioned to face each other, with the drive coil being interposed in between.

The actuator arm 155 is held by ball bearings (not shown) provided at two points on and under a bearing 157, and is made rotatably slidable by the voice coil motor 156.

Figure 10:
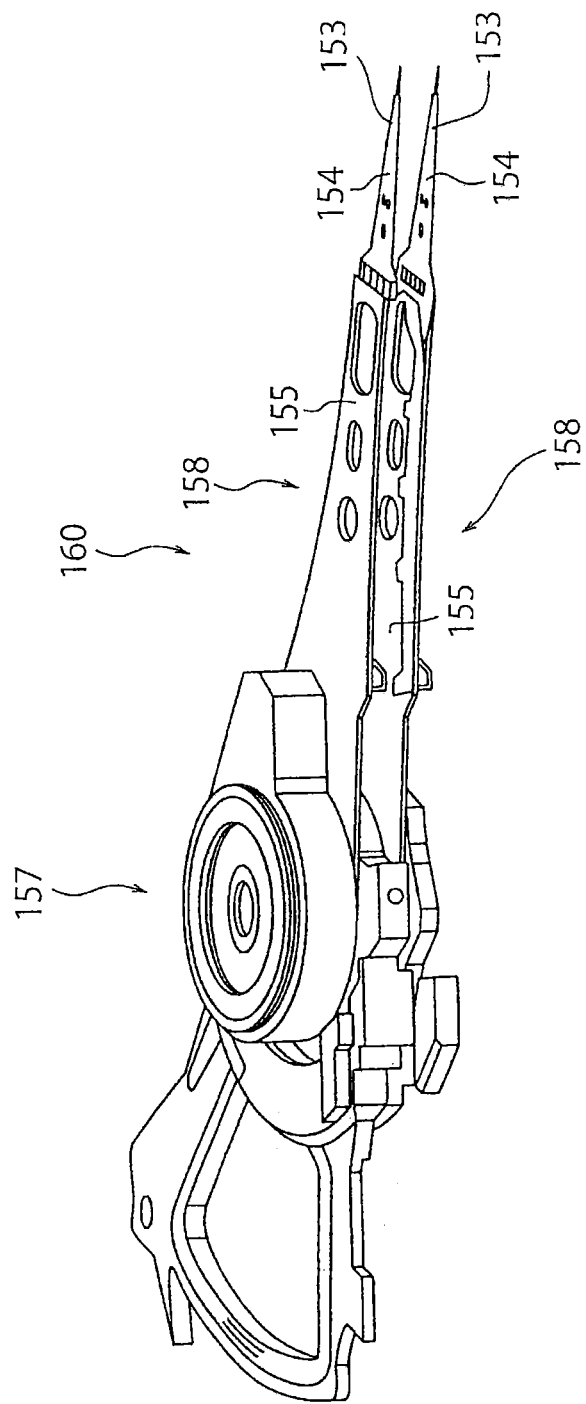
FIG. 10 is a perspective view of a head stack assembly on which a head slider is mounted.

FIG. 10 shows an example structure, of part of the magnetic recording/reproducing apparatus according to this embodiment. FIG. 10 is an enlarged perspective view of the magnetic head assembly 160 ahead of the actuator arm 155, viewed from the disk side. As shown in FIG. 10, the magnetic head assembly 160 includes the bearing 157, a head gimbal assembly (hereinafter referred to as HGA) 158 extending from the bearing 157, and a support frame that extends from the bearing 157 in the opposite direction from the HGA 158 and supports the coil of the voice coil motor 156. The HGA 158 includes the actuator arm 155 extending from the bearing 157, and the suspension 154 extending from the actuator arm 155.

The head slider 153 having a magnetic head of one of the above described first through fifth embodiments is attached to the edge of the suspension 154.

That is, the magnetic head assembly 160 according to this embodiment includes a magnetic head according to one of the first through fifth embodiments, the suspension 154 having the magnetic head mounted at one end thereof, and the actuator arm 155 connected to the other end of the suspension 154.

The suspension 154 has a lead wire (not shown) for signal writing and reading, and the lead wire is electrically connected to the respective electrodes of the magnetic recording head incorporated into the head slider 153. Electrode pads (not shown) are also provided in the magnetic head assembly 160. In this embodiment, six electrode pads are provided. Specifically, two electrode pads are provided for the coil of the main magnetic pole, two electrode pads are provided for the magnetic reproducing device (or the spin-torque oscillator 10), and two electrode pads are provided for DFH (dynamic flying height).

A signal processing unit 190 (not shown) that performs signal writing and reading on the magnetic recording medium by using the magnetic recording head is provided. The signal processing unit 190 is located on the back surface side of the magnetic recording/reproducing apparatus 150 illustrated in FIG. 9, for example. The input/output lines of the signal processing unit 190 are connected to the electrode pads, and are electrically joined to the magnetic recording head.

As described above, the magnetic recording/reproducing apparatus 150 according to this embodiment includes: a magnetic recording medium; a magnetic head according to one of the first through fifth embodiments; a movable unit that separates the magnetic recording medium from the magnetic head or allows the magnetic recording medium and the magnetic head to move relative to each other while facing each other and being in contact with each other; a position control unit that positions the magnetic head to a predetermined recording position on the magnetic recording medium; and a signal processing unit that performs signal writing and reading on the magnetic recording medium by using the magnetic head. That is, the recording medium disk 180 is used as the above magnetic recording medium. The above movable unit can include the head slider 153. The above position control unit can include the magnetic head assembly 160.

The magnetic disk 180 is rotated, to cause the voice coil motor 156 to rotate the actuator arm 155. In this manner, the head slider 153 is placed above the magnetic disk 180. The air bearing surface (ABS) of the head slider 153 having the magnetic head mounted thereon is held at a predetermined floating distance from the surface of the magnetic disk 180. In this situation, the information recorded on the magnetic disk 180 can be read based on the above described principles.

As described above, the seventh embodiment can also achieve high-output and high-Q oscillations, like the first embodiment.

EXAMPLES

Example 1

In Example 1, a spin-torque oscillator is manufactured, and the results obtained by measuring the oscillation characteristics of the spin-torque oscillator are described below. Film formation is performed by using a sputtering device. An upper electrode and a lower electrode are formed by photolithography and ion milling, and the film stack in the spin-torque oscillator is processed by electron lithography and ion milling.

Figure 11:
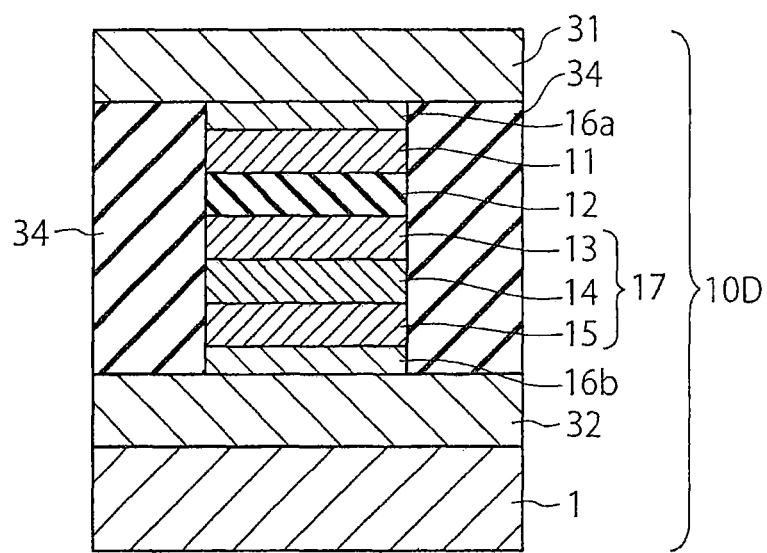
FIG. 11 is a cross-sectional view of a spin-torque oscillator according to an Example 1.

FIG. 11 is a cross-sectional view of the manufactured spin-torque oscillator 10D. The spin-torque oscillator 10D is formed on a substrate 1. The spin-torque oscillator 10D has a stack structure in which a lower electrode 32, an adjustment layer 16b, a third ferromagnetic layer 15, a second nonmagnetic layer 14, a second ferromagnetic layer 13, a first nonmagnetic layer 12, a first ferromagnetic layer 11, an adjustment layer 16a, and an upper electrode 31 are stacked in this order on the substrate 1. The adjustment layer 16b, the third ferromagnetic layer 15, the second nonmagnetic layer 14, the second ferromagnetic layer 13, the first nonmagnetic layer 12, the first ferromagnetic layer 11, and the adjustment layer 16a constitute a pillar-like film stack that is collectively processed. An insulating film 34 is provided around this film stack.

The first ferromagnetic layer 11 is a 2-nm thick CoFeB layer, the first nonmagnetic layer 12 is a 0.7-nm thick MgO layer, the second ferromagnetic layer 13 is a 3-nm thick CoFeB layer, the second nonmagnetic layer 14 is a 0.85-nm thick Ru layer, and the third ferromagnetic layer 15 is a 2.5-nm thick CoFe layer. The second ferromagnetic layer 13 and the third ferromagnetic layer 15 are antiferromagnetically coupled to each other via the second nonmagnetic layer 14, to constitute an antiferromagnetically-coupled film (an artificial ferrimagnetic film) 17. Each of the adjustment layers 16a and 16b is a 2-nm thick Ta layer. The thickness of the spin-torque oscillator 10D minus the upper electrode 31, the lower electrode 32, and the adjustment layers 16a and 16d is 11 nm or smaller.

A Ta/Cu/Ta layer is used as the lower electrode 32, and an Au/Ta/Cu/Ta layer is used as the upper electrode 31. In this specification, "X/Y" means that X is the upper layer, and Y is the lower layer. A $SiO_2$ layer is used as the insulating film 34. By applying current, magnetization precession of the CoFeB layer as the second ferromagnetic layer 13 is induced.

The planar shape of the film stack of the spin-torque oscillator 10D is elliptical. The length of the short axis is approximately 70 nm, and the length of the long axis is 120 nm. In the spin-torque oscillator 10D, uniaxial anisotropy is provided through shape anisotropy. That is, the long axis of the ellipse is the easy axis of magnetization, and the short axis is the hard axis of magnetization. The device resistance of the spin-torque oscillator 10D is 170Ω, and the MR ratio (ΔR/R) is approximately 26.5%. In the spin-torque oscillator 10D, the lead of the upper electrode 31 and the lead of the lower electrode 32 are designed to be coplanar guides (waveguides) with a characteristic impedance of 50Ω.

Figure 12:
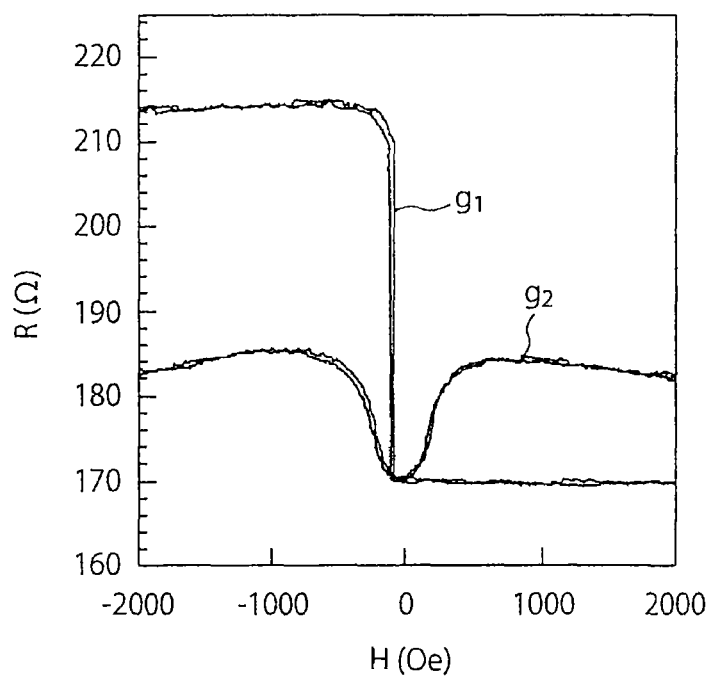
FIG. 12 is a graph showing the resistance-field curves obtained in a case where a magnetic field is applied to the spin-torque oscillator of the Example 1.

FIG. 12 shows the resistance-field curves obtained in a case where a magnetic field is applied in the direction of the easy axis of magnetization of the spin-torque oscillator 10D, and in a case where a magnetic field is applied in the direction of the hard axis of magnetization. A graph $g_1$ represents the resistance-field curve obtained in the case where a magnetic field is applied in the direction of the easy axis of magnetization, and a graph $g_2$ represents the resistance-field curve obtained in the case where a magnetic field is applied in the direction of the hard axis of magnetization. As indicated by the graph $g_1$, in the case where a magnetic field is applied in the direction of the easy axis of magnetization, the magnetization direction of the CoFeB layer as the second ferromagnetic layer 13 is not reversed even when a magnetic field of 2000 Oe or greater is applied. Accordingly, it is apparent that, with this structure, an antiparallel state can be maintained over a wide magnetic field range.

Figure 13:
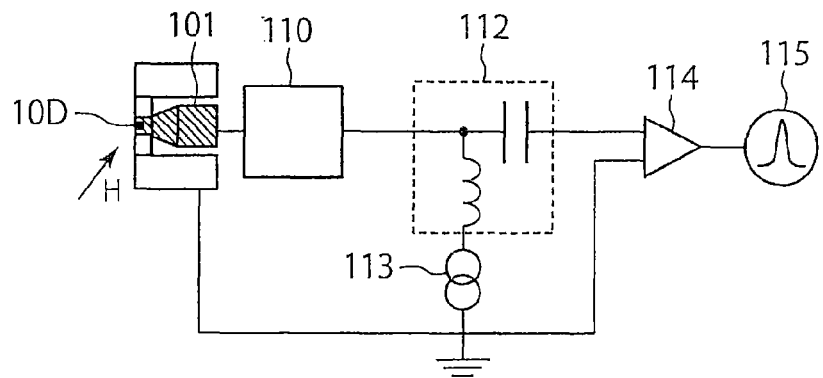
FIG. 13 is a block diagram of a measurement system that measures the oscillation power spectrums of spin-torque oscillators.

Next, oscillation power spectrums of the spin-torque oscillator 10D of Example 1 are measured. To measure oscillation power spectrums, the measurement system illustrated in FIG. 13 is used. In this measurement system, a high-frequency oscillation signal generated from the spin-torque oscillator 10D is transmitted to a high-frequency probe 111 via a waveguide 101, and the high-frequency oscillation signal is detected. The detected high-frequency oscillation signal is sent to an amplifier 114 via a bias tee 112, and is amplified. The amplified signal is detected by a spectrum analyzer 115. A DC power source 113 is connected to the bias tee 112. An external magnetic field H is applied to the spin-torque oscillator 10D from a direction deviating several degrees from the easy axis of magnetization in a direction parallel to the film plane.

Figure 14:
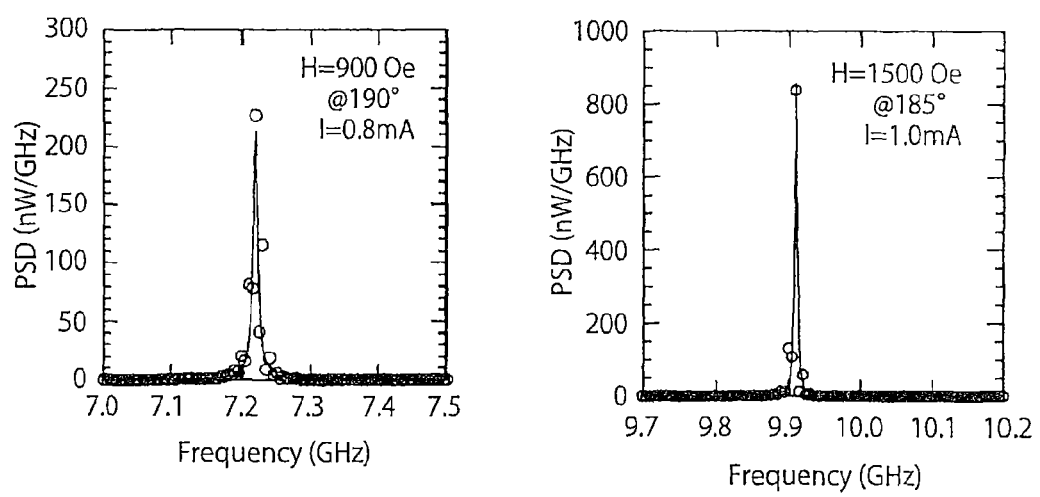
FIG. 14 are graphs showing the results of measurement of the oscillation power spectrums of the spin-torque oscillator of Example 1.

A magnetic field that is almost in the opposite direction of the magnetization of the second ferromagnetic layer 13 is applied to the spin-torque oscillator 10D of Example 1, and an external magnetic field is applied so that the magnetization directions of the first ferromagnetic layer 11 and the second ferromagnetic layer 13 become substantially antiparallel to each other. Current is applied in the direction from the first ferromagnetic layer 11 toward the second ferromagnetic layer 13, and mainly the first ferromagnetic layer 11 is caused to oscillate. FIGS. 14(a) and 14(b) show the power spectrums measured by the measurement system illustrated in FIG. 13. High-Q and high-output oscillations are achieved over a magnetic field range around an external magnetic field (approximately 1400 Oe) in which the magnetic resonance frequency of the first ferromagnetic layer 11 crosses the magnetic resonance frequency of the artificial ferrimagnetic layer 17. Where the magnitude H of the external magnetic field is 900 Oe, the angle formed between the magnetization directions of the first ferromagnetic layer 11 and the second ferromagnetic layer 13 is 190 degrees, and the applied current is 0.8 mA, oscillations of 9 MHz in oscillation linewidth and 3 nW in output are achieved (FIG. 14(a)). Where the magnitude H of the external magnetic field is 1500 Oe, the angle formed between the magnetization directions of the first ferromagnetic layer 11 and the second ferromagnetic layer 13 is 185 degrees, and the applied current is 1.0 mA, oscillations of 4 MHz in oscillation linewidth and 6 nW in output are achieved (FIG. 14(b)).

Example 2

A spin-torque oscillator is manufactured, and the oscillation characteristics of the spin-torque oscillator are measured. The results of the measurement are described in the following. Film formation is performed by using a sputtering device. An upper electrode and a lower electrode are formed by photolithography and ion milling, and the film stack in the spin-torque oscillator is processed by electron lithography and ion milling.

Figure 15:
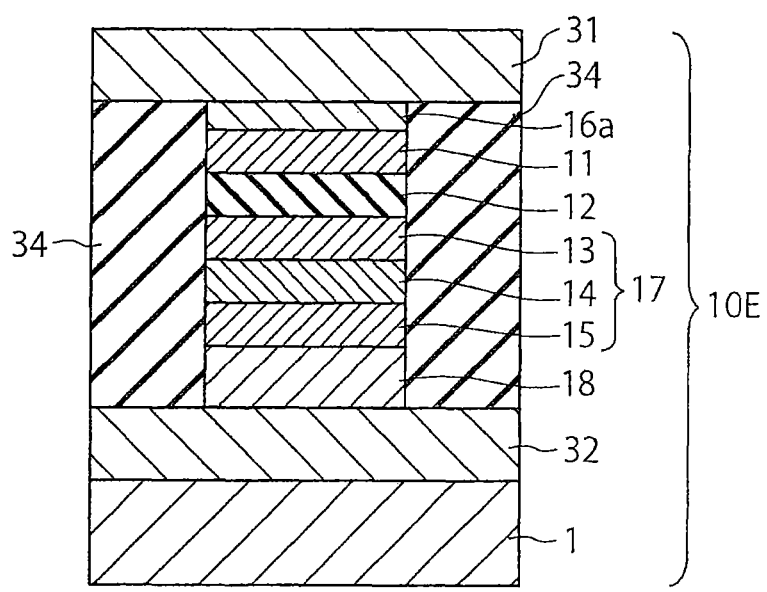
FIG. 15 is a cross-sectional view of a spin-torque oscillator according to an Example 2.

FIG. 15 is a cross-sectional view of the manufactured spin-torque oscillator 10E. The spin-torque oscillator 10E is formed on a substrate 1. The spin-torque oscillator 10E has a stack structure in which a lower electrode 32, an antiferromagnetic material layer 18, a third ferromagnetic layer 15, a second nonmagnetic layer 14, a second ferromagnetic layer 13, a first nonmagnetic layer 12, a first ferromagnetic layer 11, an adjustment layer 16a, and an upper electrode 31 are stacked in this order on the substrate 1. The second ferromagnetic layer 13 and the third ferromagnetic layer 15 are antiferromagnetically coupled to each other via the second nonmagnetic layer 14, to constitute an antiferromagnetically-coupled film (an artificial ferrimagnetic film) 17. The antiferromagnetic material layer 18, the third ferromagnetic layer 15, the second nonmagnetic layer 14, the second ferromagnetic layer 13, the first nonmagnetic layer 12, the first ferromagnetic layer 11, and the adjustment layer 16a constitute a pillar-like film stack that is collectively processed. An insulating film 34 is provided around this film stack.

The first ferromagnetic layer 11 is a 2-nm thick CoFeB layer, the first nonmagnetic layer 12 is a 0.7-nm thick MgO layer, the second ferromagnetic layer 13 is a 3-nm thick CoFeB layer, the second nonmagnetic layer 14 is a 0.85-nm thick Ru layer, the third ferromagnetic layer 15 is a 2.5-nm thick CoFe layer, and the antiferromagnetic material layer 18 is a 2-nm thick IrMn layer. The adjustment layer 16a is a 2-nm thick Ta layer. The thickness of the spin-torque oscillator 10E minus the upper electrode 31, the lower electrode 32, and the adjustment layer 16a is 13 nm or smaller.

A Ta/Cu/Ta layer is used as the lower electrode 32, and an Au/Ta/Cu/Ta layer is used as the upper electrode 31. In this specification, "X/Y" means that X is the upper layer, and Y is the lower layer. A SiO$_2$ layer is used as the insulating film 34. By applying current, magnetization precession of the CoFeB layer as the second ferromagnetic layer 13 is induced.

The planar shape of the film stack of the spin-torque oscillator 10E is elliptical. The length of the short axis is approximately 70 nm, and the length of the long axis is 120 nm. In the spin-torque oscillator 10E, uniaxial anisotropy is provided through shape anisotropy.

The device resistance of the spin-torque oscillator 10E is 180Ω, and the MR ratio (ΔR/R) is approximately 25%.

A magnetic field that is almost in the opposite direction of the magnetization of the second ferromagnetic layer 13 is applied to the spin-torque oscillator 10E of Example 2, and an external magnetic field is applied so that the magnetization directions of the first ferromagnetic layer 11 and the second ferromagnetic layer 13 become substantially antiparallel to each other. Current is applied in the direction from the first ferromagnetic layer 11 toward the second ferromagnetic layer 13, and mainly the first ferromagnetic layer 11 is caused to oscillate. The power spectrums at this point are measured by the measurement system illustrated in FIG. 13. High-Q and high-output oscillations are achieved over a magnetic field range around an external magnetic field (approximately 1300 Oe) in which the magnetic resonance frequency of the first ferromagnetic layer 11 crosses the magnetic resonance frequency of the artificial ferrimagnetic layer 17. Where the magnitude H of the external magnetic field is 900 Oe, the angle formed between the magnetization directions of the first ferromagnetic layer 11 and the second ferromagnetic layer 13 is 190 degrees, and the applied current is 0.8 mA, oscillations of 16 MHz in oscillation linewidth and 4 nW in output are achieved.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic head comprising
a spin-torque oscillator,
the spin-torque oscillator comprising a first ferromagnetic layer, a second ferromagnetic layer, a third ferromagnetic layer provided on the opposite side of the second ferromagnetic layer from the first ferromagnetic layer, a first nonmagnetic layer provided between the first ferromagnetic layer and the second ferromagnetic layer, a second nonmagnetic layer provided between the second ferromagnetic layer and the third ferromagnetic layer, a first electrode provided on a surface on the opposite side of the first ferromagnetic layer from the first nonmagnetic layer, and a second electrode provided on a surface on the opposite side of the third ferromagnetic layer from the second nonmagnetic layer,
wherein the second ferromagnetic layer and the third ferromagnetic layer are antiferromagnetically coupled to each other via the second nonmagnetic layer, magnetization directions of the first ferromagnetic layer and the second ferromagnetic layer are antiparallel to each other when current is not applied between the first and second electrodes, and magnetization precession is induced in each of the first through third ferromagnetic layers when current is applied between the first and second electrodes, and
wherein the first, second and third ferromagnetic layers are free layers.

2. The head according to claim 1, wherein the first ferromagnetic layer and the second ferromagnetic layer are 50 nm or less in size.

3. The head according to claim 1, further comprising a hard bias film configured to apply a magnetic field to make the magnetization directions of the first ferromagnetic layer and the second ferromagnetic layer antiparallel to each other.

4. The head according to claim 1, wherein current is applied in a direction from the first ferromagnetic layer toward the second ferromagnetic layer.

5. The head according to claim 1, wherein current is applied in a direction from the second ferromagnetic layer toward the first ferromagnetic layer.

6. The head according to claim 1, wherein the first nonmagnetic layer is an insulating layer.

7. The head according to claim 1, wherein each of the first and second electrodes is made of a shield material that shields a magnetic field, and an adjustment layer is provided in at least one of between the first electrode and the first ferromagnetic layer, and between the second electrode and the third ferromagnetic layer.

8. A magnetic recording/reproducing apparatus comprising:
a magnetic recording medium;
a magnetic head according to claim 1;
a movement control unit configured to control the magnetic recording medium and the magnetic head to move relative to each other while facing each other in a floating or contact state;
a position control unit configured to control the magnetic head to be located in a predetermined recording position on the magnetic recording medium; and
a signal processor configured to process a write signal to be written on the magnetic recording medium and a read signal read from the magnetic recording medium by using the magnetic head.

9. A magnetic sensor comprising:
the magnetic head according to claim 1; and
a monitoring device configured to monitor one of change in amplitude of a high-frequency oscillation voltage generated between the first and second electrodes due to magnetization precession induced in the first through third ferromagnetic layers upon application of current to the magnetic head, and change in oscillation frequency caused by an external magnetic field.

10. A magnetic head, comprising:
a spin-torque oscillator,
the spin-torque oscillator comprising a first ferromagnetic layer, a second ferromagnetic layer, a third ferromagnetic layer provided on the opposite side of the second ferromagnetic layer from the first ferromagnetic layer, a first nonmagnetic layer provided between the first ferromagnetic layer and the second ferromagnetic layer, a second nonmagnetic layer provided between the second ferromagnetic layer and the third ferromagnetic layer, a first electrode provided on a surface on the opposite side of the first ferromagnetic layer from the first nonmagnetic layer, and a second electrode provided on a surface on the opposite side of the third ferromagnetic layer from the second nonmagnetic layer,
wherein the second ferromagnetic layer and the third ferromagnetic layer are antiferromagnetically coupled to each other via the second nonmagnetic layer, magnetization directions of the first ferromagnetic layer and the second ferromagnetic layer are antiparallel to each other when current is not applied between the first and second electrodes, and magnetization precession is induced in each of the first through third ferromagnetic layers when current is applied between the first and second electrodes, and wherein a magnetic moment of the third ferromagnetic layer is larger than a magnetic moment of the second ferromagnetic layer.

11. A magnetic sensor comprising:

the magnetic head according to claim 10; and a monitoring device configured to monitor one of change in amplitude of a high-frequency oscillation voltage generated between the first and second electrodes due to magnetization precession induced in the first through third ferromagnetic layers upon application of current to the magnetic head, and change in oscillation frequency caused by an external magnetic field.

12. The sensor according to claim 11, wherein the first ferromagnetic layer and the second ferromagnetic layer are 50 nm or less in size.

13. The sensor according to claim 11, further comprising a hard bias film configured to apply a magnetic field to make the magnetization directions of the first ferromagnetic layer and the second ferromagnetic layer antiparallel to each other.

14. The sensor according to claim 11, wherein current is applied in a direction from the first ferromagnetic layer toward the second ferromagnetic layer.

15. The sensor according to claim 11, wherein current is applied in a direction from the second ferromagnetic layer toward the first ferromagnetic layer.

16. The sensor according to claim 11, wherein the first nonmagnetic layer is an insulating layer.

17. The sensor according to claim 11, wherein each of the first and second electrodes is made of a shield material that shields a magnetic field, and an adjustment layer is provided in at least one of between the first electrode and the first ferromagnetic layer, and between the second electrode and the third ferromagnetic layer.

18. A magnetic recording/reproducing apparatus comprising:

a magnetic recording medium;

a magnetic head according to claim 10;

a movement control unit configured to control the magnetic recording medium and the magnetic head to move relative to each other while facing each other in a floating or contact state;

a position control unit configured to control the magnetic head to be located in a predetermined recording position on the magnetic recording medium; and a signal processor configured to process a write signal to be written on the magnetic recording medium and a read signal read from the magnetic recording medium by using the magnetic head.

* * * * *